United States Patent [19]

Inoue

[11] Patent Number: 5,096,845
[45] Date of Patent: Mar. 17, 1992

[54] METHOD OF MAKING FIELD EFFECT TRANSISTORS IN AN INNER REGION OF A HOLE

[75] Inventor: Yasuo Inoue, Hyogo, Japan

[73] Assignee: Mitsubishi Denki Kabushika Kaisha, Tokyo, Japan

[21] Appl. No.: 496,714

[22] Filed: Mar. 21, 1990

Related U.S. Application Data

[62] Division of Ser. No. 279,689, Dec. 5, 1988, Pat. No. 4,933,734.

[30] Foreign Application Priority Data

Dec. 8, 1987 [JP] Japan .................................. 62-311374

[51] Int. Cl.[5] .................................. H01L 21/70
[52] U.S. Cl. .................................. 437/40; 437/41; 437/47; 437/52; 437/89; 437/915
[58] Field of Search .................. 437/41, 38, 40, 47, 437/52, 51, 60, 89, 81, 228, 233, 235, 249, 915; 357/23.6, 51, 23.7, 4

[56] References Cited

U.S. PATENT DOCUMENTS

| | | | |
|---|---|---|---|
| 3,942,241 | 3/1976 | Harigaya et al. | 437/162 |
| 4,101,350 | 7/1978 | Possley et al. | 437/34 |
| 4,280,272 | 2/1981 | Egawa et al. | 437/34 |
| 4,399,605 | 8/1983 | Dash et al. | 437/34 |
| 4,414,737 | 11/1983 | Menjo et al. | 437/162 |
| 4,549,340 | 10/1985 | Wagasawa | 437/34 |
| 4,685,196 | 8/1987 | Lee | 437/41 |
| 4,698,316 | 10/1987 | Corboy, Jr. et al. | 437/87 |
| 4,751,557 | 6/1988 | Sunami et al. | 357/23.6 |
| 4,824,799 | 4/1989 | Komatsu | 437/89 |
| 4,845,046 | 7/1989 | Shimbo | 437/162 |
| 4,937,202 | 6/1990 | Mass | 437/38 |
| 4,965,219 | 10/1990 | Cerofolini | 437/41 |

OTHER PUBLICATIONS

T. Kamins and D. Bradbury "Trench-Isolated Transistors in Lateral Epitaxial Silicon-on-Insulator Films" IEEE Electron Devices, vol. EDL-5, No. 11 (Nov. 1984); 449,451.

W. Richardson et al., "A Trench Transistor Cross--Point Dram Cell" IEDM 85, Technical Digest (1985): 714, 717.

*Primary Examiner*—Brian E. Hearn
*Assistant Examiner*—Tom Thomas
*Attorney, Agent, or Firm*—Lowe, Price, LeBlanc & Becker

[57] ABSTRACT

A channel surface with a channel region and a gate electrode opposing to each other is formed approximately vertical to a main surface of a semiconductor substrate in the field effect transistor (FET). A p type (n type) single crystal silicon layer is formed in a hole of an insulating layer on the main surface of the substrate. N type (p type) drain and source regions are formed defining the channel region in the single crystal silicon layer. A gate electrode is formed above the channel region on the side wall of the single crystal silicon layer in the hole. The area of the main surface of the substrate occupied by one FET can be reduced in this manner. A semiconductor device can be provided in which FETs are integrated to a higher degree without degrading performance of the transistors. The method for manufacturing the semiconductor device comprises the steps of forming an insulating layer with a hole reaching to the main surface of the substrate, forming a single crystal silicon layer in the hole, forming a gate electrode on the side wall surface of the single crystal silicon layer, and forming source and drain regions in the single crystal silicon layer in selfalignment.

8 Claims, 10 Drawing Sheets

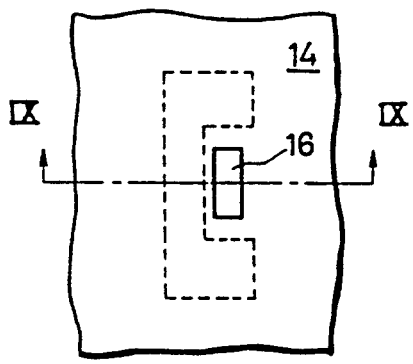
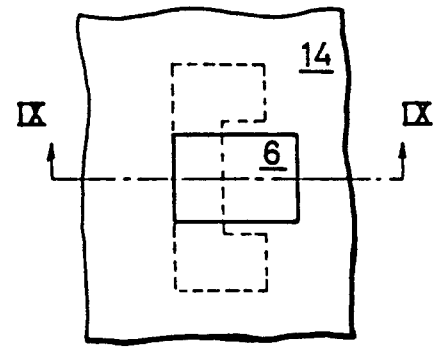
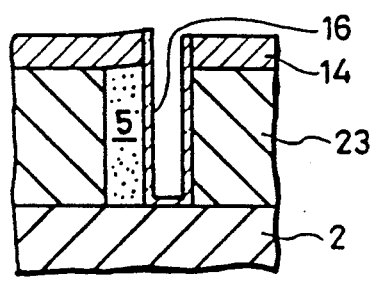
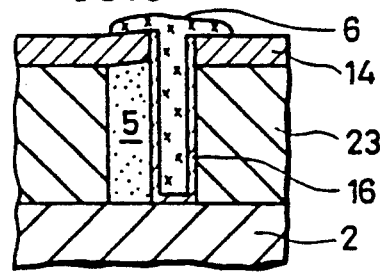
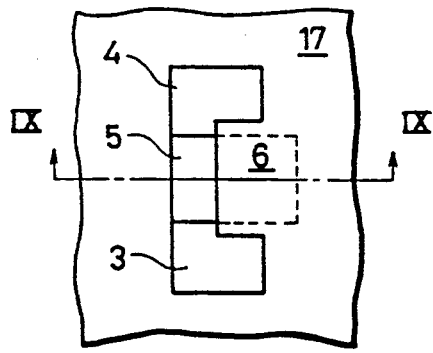
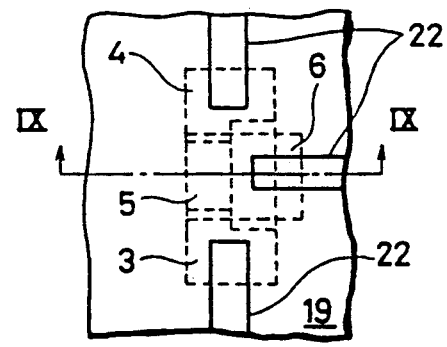
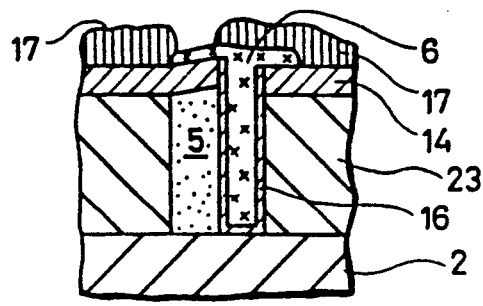
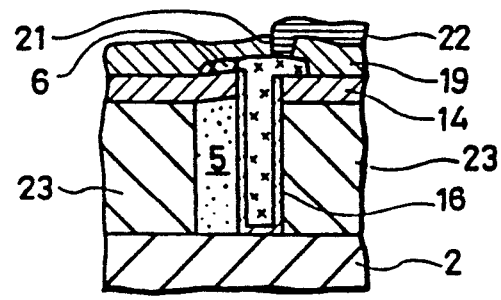

METHOD OF MAKING FIELD EFFECT TRANSISTORS IN AN INNER REGION OF A HOLE

This application is a division application of application Ser. No. 07/279,689, filed Dec. 5, 1988, now U.S. Pat. No. 4,933,734.

BACKGROUND OF THE INVENTION

1. Field of the Invention

The present invention relates to semiconductor devices having field effect transistors and, more specifically, to semiconductor devices having field effect transistors with higher degree of integration. The present invention also relates to a method for manufacturing such semiconductor devices having field effect transistors. The present invention has particular utility in the field of gate arrays.

2. Description of the Background Art

Recently, there have been various types of LSIs (Large Scale Integrated Circuits) for specific or dedicated use, and different products are provided for different users. In other words, small numbers of various types of products must be provided, and various different manufacturing processes have been needed to provide various types of products for various users. Consequently, when we consider mask patterns employed during the manufacturing processes, for example, various patterns must be designed and various masks must be prepared corresponding to various products. Therefore, the time for developing and designing one LSI becomes longer and the manufacturing cost thereof is increased.

In view of the foregoing, gate arrays are proposed and have been commercially available which enable manufacturing of various types of semiconductor devices by changing only some steps of the manufacturing process. A gate array comprises gates which are called elemental cells arranged regularly (in an array) on an LSI chip. It is a semicustom LSI designed by making the best use of CAD with the design, development and manufacturing process of a custom LSI being standardized to a large extent. Although the chip size of the gate array is increased compared with a fullcustom LSI, the time for development and the manufacturing cost thereof can be reduced. Therefore, the gate arrays have been continuously improved and developed to provide higher performance and functions from the first actual application in early 1970's. The gate array comprises semiconductor elements shown in FIG. 1 repeatedly arranged regularly, and the gate array realizes a desired function only by determining a wiring pattern in accordance with a logic circuit diagram. Therefore, the gate array enables reduction of the designing cost, greatly reducing the time required for development, and it is suitable for providing small numbers of various types of products.

FIG. 1 is a schematic prospective view of an n channel MOS transistor constituting the gate array. Referring to the figure, the MOS transistor $Q_0$ comprises n type source 103 and drain 104 formed by diffusing n type impurities to a p type silicon substrate 2. A gate 106 formed of polysilicon is provided above a channel region 105 having a channel surface 105a formed between the source 103 and the drain 104, with a gate oxide layer (not shown) interposed therebetween. Other oxide layers and aluminum wirings are omitted in FIG. 1.

Since the n channel MOS transistor $Q_0$ constituting the conventional gate array is structured as described above, an area $S_1$ required for forming one n channel MOS transistor $Q_0$ will be approximately $$S_1 = (L_C + L_D + L_S) \times D_1 \tag{1}$$

as can be seen from FIG. 1. In the equation (1), the reference character $L_C$ represents a channel length, $L_D$ and $L_S$ represent the lengths of the drain 104 and the source 103 and $D_1$ represents a channel width.

Therefore, in order to improve the degree of integration of the transistors in the gate array, that is, to improve the degree of integration of the n channel MOS transistors $Q_0$ on the substrate 2, the n channel MOS transistor $Q_0$ itself must be made compact by reducing the channel length $L_C$, the lengths $L_D$ and $L_S$ of the drain 104 and the source 103 and the channel width $D_1$ of each n channel MOS transistor $Q_0$. However, when the n channel MOS transistor $Q_0$ itself is made compact, the electrical characteristics of the transistor is degraded. For example, when the channel length $L_C$ is reduced to minimize the size of the n channel MOS transistor $Q_0$, a short channel effect occurs, namely, the threshold voltage $V_{TH}$ of the MOS transistor reduces as the channel length becomes shorter. As the size of the MOS transistor is minimized, the MOS transistor shows undesired characteristics.

In order to solve the above described problem, one example of a semiconductor device capable of providing higher degree of integration without miniaturizing the transistor itself is disclosed in 1985, IEDM, Technical Digest, pp. 714–717, "A TRENCH TRANSISTOR CROSS-POINT DRAM CELL". FIG. 2 is a partial cross sectional view showing a cross sectional structure of such semiconductor device. Referring to FIG. 2, a dynamic memory cell is formed isolated by an isolating oxide layer 210 on a main surface of a p type silicon substrate 202. The dynamic memory cell comprises an n channel MOS transistor and a capacitor. The n channel MOS transistor has a drain 203 and a source 204 formed of n+ regions, a channel region 205 provided therebetween, and a gate electrode 206 formed on the channel region 205. The channel region 205 exists below a gate oxide layer 205a which is formed along a side wall portion of a trench formed on the main surface of the silicon substrate 202. The capacitor comprises a capacitor electrode 220 formed to be connected to the source 204 constituting the n channel MOS transistor and a capacitor oxide layer 230. The capacitor electrode 220 is formed of a polysilicon layer buried in the trench formed in the p type silicon substrate 202. The source 204 is provided in a ring around the capacitor electrode 220. The gate electrode 206 constituting the n channel MOS transistor is formed of polysilicon and it also serves as a word line.

In the dynamic memory cell shown in FIG. 2, a vertical n channel MOS transistor is formed on the side wall portion of the trench provided for the capacitor. By doing so, the horizontal area occupied by the n channel MOS transistor on the main surface of the substrate is reduced, but the transistor itself is not miniaturized and the performance of the transistor is maintained by forming the channel region on the side wall portion, for example.

However, in this structure, the source 204 is formed by diffusing impurities included in the n+ type polysilicon, which is buried in the trench to form the capacitor electrode 220, by thermal processing. Therefore, it is difficult to apply the structure shown in this prior art to a structure of a MOS transistor with the source region not connected to an electrode or the like constituting the capacitor. In addition, an undercut must be provided between the n+ type polysilicon buried in the trench and the p type silicon substrate 202, and the polysilicon must be buried again in the undercut portion to form the source 204. This makes the manufacturing process complicated. The channel region 205 is provided on the side wall of the trench formed in the p type silicon substrate 202. Therefore, the channel length is controlled by changing the time of etching carried out to form the trench. Therefore, adjustment of the channel length is more difficult compared with a normal case in which the channel is adjusted by mask patterns.

SUMMARY OF THE INVENTION

Therefore, one object of the present invention is to provide a semiconductor device in which the horizontal area occupied by a field effect transistor is reduced to improve the degree of integration of the field effect transistors.

Another object of the present invention is to provide a semiconductor device capable of reducing horizontal area occupied by the field effect transistors without degrading the performance of each of the field effect transistors itself.

A further object of the present invention is to provide a semiconductor device in which field effect transistors are integrated to a higher degree, with the channel length of each transistor being well adjusted.

A still further object of the present invention is to provide a gate array having high degree of integration of the field effect transistors.

A still further object of the present invention is to provide a method for manufacturing a semiconductor device in which horizontal area occupied by the field effect transistors is reduced to improve the degree of integration of the field effect transistors.

A still further object of the present invention is to provide a method for manufacturing a semiconductor device in which the horizontal area occupied by the field effect transistors can be reduced without degrading the performance of each of the field effect transistors itself.

A still further object of the present invention is to provide a method for manufacturing a semiconductor device having field effect transistors capable of easily manufacturing vertical field effect transistors.

A still further object of the present invention is to provide a method for manufacturing a semiconductor device in which field effect transistors are integrated to a higher degreed with the channel length of each transistor being well adjusted.

A still further object of the present invention is to provide a method for manufacturing a gate array having high degree of integration of the field effect transistors.

A semiconductor device having field effect transistors in accordance with the present invention comprises a semiconductor substrate, an insulating layer, a single crystal semiconductor layer of a first conductivity type, first and second impurity regions of a second conductivity type, and a gate electrode. The insulating layer is formed on a main surface of the semiconductor substrate and has a hole whose bottom surface being a portion of the exposed main surface of the semiconductor substrate. The single crystal semiconductor layer of the first conductivity type is formed on the bottom surface and a side wall surface of the hole of the insulating layer. The first and second impurity regions are formed spaced apart from each other in the single crystal semiconductor layer region. The first and second impurity regions define a channel region in the single crystal semiconductor layer. The gate electrode is formed on the side wall surface of the single crystal semiconductor layer above the channel region with a gate insulating layer interposed therebetween, the gate electrode being insulated from a portion of the exposed main surface of the semiconductor substrate in the hole of the insulating layer.

According to a preferred embodiment of the present invention, the horizontal shape of the hole of the insulating layer is approximately rectangular. The horizontal shape of the single crystal semiconductor layer is approximately rectangular with one side opened and, preferably, the channel region is formed at the center and the first and second impurity regions are formed on the opposing end portions of the rectangular shape with one side opened. The gate electrode may include a conductive layer formed buried in the hole of the insulating layer between the first and second impurity regions, being insulated from these regions. The gate electrode may comprise an electrode portion formed on the channel region with a gate insulating layer interposed therebetween and a contact portion having a surface electrically connected to the wiring layer, extending from the electrode portion and formed on the upper surface of the single crystal semiconductor layer with an insulating layer interposed therebetween.

A semiconductor device having a field effect transistor of a first conductivity type and a field effect transistor of a second conductivity type in accordance with another aspect of the present invention comprises a semiconductor substrate, an insulating layer, a first single crystal semiconductor layer of the first conductivity type, first and second impurity regions of the second conductivity type, a first gate electrode, a second single crystal semiconductor layer of the second conductivity type, third and fourth impurity regions of the first conductivity type and a second gate electrode. The insulating layer is formed on the main surface of the semiconductor substrate and has a hole whose bottom surface being a portion of the exposed main surface of the semiconductor substrate. The first single crystal semiconductor layer is formed in the hole of the insulating layer on the bottom surface and at least on one side wall surface of the hole. The first and second impurity regions are formed spaced apart from each other in a region of the first single crystal semiconductor layer. The first and second impurity regions define a first channel region in the first single crystal semiconductor layer. The first gate electrode is formed in the hole of the insulating film on the side wall surface of the first single crystal semiconductor layer above the first channel region with a gate insulating layer interposed therebetween. The second single crystal semiconductor layer is formed in the hole of the insulating layer on the bottom surface and at least on the other side wall surface of the hole. The third and fourth impurity regions are formed spaced apart from each other in the region of the second single crystal semiconductor layer. The third and fourth impurity regions define a second channel region in the second single crystal semiconductor layer. The second gate electrode is formed in the hole of the insulating layer above the second channel region on the side wall surface of the second single crystal semiconductor layer with a gate insulating layer interposed therebetween, the electrode being insulated from a portion of the exposed main surface of the semiconductor substrate.

According to a preferred embodiment of a semiconductor device in accordance with another aspect of the present invention, the first gate electrode and the second gate electrode comprise a common gate electrode in which the gate electrodes are formed integrally. The horizontal shape of the hole of the insulating layer is approximately rectangular. The first single crystal semiconductor layer is formed along one side wall surface of the hole of the insulating layer, with the horizontal shape thereof being approximately rectangular with one side opened. Preferably, a first channel region is formed at the center of the approximately rectangular shape with one side opened of the first single crystal semiconductor layer, and the first and second impurity regions are formed on the opposing end portions of the approximately rectangular shape with one side opened. The second single crystal semiconductor layer is formed opposing to the first single crystal semiconductor layer, along the other side wall surface of the hole of the insulating layer with the horizontal shape being approximately rectangular with one side opened. Preferably, a second channel region is formed at the center, and the third and fourth impurity regions are formed on the opposing end portions of the approximately rectangular shape with one side opened. The first and second gate electrodes may include a conductive layer formed in a region surrounded by the first and second single crystal semiconductor layers buried in the hole of the insulating layer, insulated from the semiconductor layers.

According to a method for manufacturing a semiconductor device having field effect transistors in accordance with the present invention, a semiconductor substrate having a main surface is prepared at first. An insulating layer is formed on the main surface of the semiconductor substrate. A hole is formed in the insulating layer, the bottom surface thereof being a portion of the exposed main surface of the semiconductor substrate. In this hole, a single crystal semiconductor layer is formed on the main surface of the semiconductor substrate. A field effect transistor is formed in a region of the hole including the single crystal semiconductor layer.

According to a preferred embodiment of the method for manufacturing the semiconductor device, the steps of forming the field effect transistor are as follows. First, impurities of a first conductivity type are doped in the single crystal semiconductor layer to form a single crystal semiconductor layer of the first conductivity type. A hole for forming a gate electrode with the side wall surfaces being at least the single crystal semiconductor layer and the bottom surface being the main surface of the semiconductor substrate is formed by selectively removing the single crystal semiconductor layer. In the hole for forming the gate electrode, a gate insulating layer is formed on the side wall surface of the single crystal semiconductor layer. Further, in the hole for forming the gate electrode, the gate electrode is formed on the gate insulating layer. By selectively doping impurities of the second conductivity type in the region of the single crystal semiconductor layer, the first and second impurity regions of the second conductivity type are formed spaced apart from each other.

In accordance with a method for manufacturing a semiconductor device having a field effect transistor of a first conductivity type and a field effect transistor of a second conductivity type in accordance with a further aspect of the present invention, a semiconductor substrate having a main surface is prepared at first. An insulating layer is formed on the main surface of the semiconductor substrate. A hole is formed in the insulating layer with the bottom surface being a portion of the exposed main surface of the semiconductor substrate. In this hole, a single crystal semiconductor layer is formed on the main surface of the semiconductor substrate. A first single crystal semiconductor layer portion of a first conductivity type is formed by selectively doping impurities of the first conductivity type to the single crystal semiconductor layer. A second single crystal semiconductor layer portion of the second conductivity type is formed by selectively doping impurities of the second conductivity type to the single crystal semiconductor layer. In the hole including the first single crystal semiconductor layer portion, a field effect transistor of the second conductivity type is formed. On an inner region of the hole including the second single crystal semiconductor layer portion, a field effect transistor of the first conductivity type is formed.

According to a preferred embodiment of a method for manufacturing a semiconductor device in accordance with a further aspect of the present invention, a hole for forming a gate electrode with the bottom surface being main surface of the semiconductor substrate and the side wall surfaces being at least single crystal semiconductor layer portion is formed by selectively removing the single crystal semiconductor layer. The field effect transistor of the second conductivity type is formed in the following manner. First, a first gate insulating layer is formed on the sidewall surface of the single crystal semiconductor layer portion in the hole for forming the gate electrode. Thereafter, a first gate electrode is formed on the first gate insulating layer in the hole for forming the gate electrode. The first and second impurity regions of the second conductivity type are formed spaced apart from each other by selectively doping impurities of the second conductivity type in a region of the first single crystal semiconductor layer portion. The field effect transistor of the first conductivity type is formed in the following manner. First, in the hole for forming the gate electrode, a second gate insulating layer is formed on the side wall surface of the second single crystal semiconductor layer portion. Thereafter, a second gate electrode is formed on the second gate insulating layer in the hole for forming the gate electrode. The third and fourth impurity regions of the first conductivity type are formed spaced apart from each other by selectively doping impurities of the first conductivity type in the region of the second single crystal semiconductor layer portion.

In the present invention, the single crystal semiconductor layer which is a region on which the channel region should be formed is formed on the side wall surface of the hole of the insulating layer. Therefore, the channel region is formed along the side wall surfaces of the insulating layer, whereby a channel region can be provided whose channel surface being approximately vertical to the main surface of the semiconductor substrate on which the insulating layer is formed. Therefore, even if the transistors are highly integrated, the channel length is not reduced and the performance of the prescribed field effect transistor itself can be maintained. And therefore, the rate of the area occupied by one field effect transistor on the main surface of the semiconductor substrate can be substantially reduced while maintaining the performance of the field effect transistor. Consequently, the degree of integration of the field effect transistors can be improved. According to the manufacturing method of the present invention, the impurity regions constituting the field effect transistor can be formed in selfalignment, and therefore the channel length defined by the impurity regions can be easily controlled.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 8A, 8B, 8C, 8D, 8E, 8F, 8G and 8H are plan views showing a method for manufacturing an n channel MOS transistor having the structure shown in FIG. 6 in the order of manufacturing steps;

FIGS. 9A, 9B, 9C, 9D, 9E, 9F, 9G and 9H are partial cross sectional views showing the cross sections taken along the lines IX—IX of the plan views shown in FIGS. 8A to 8H;

DESCRIPTION OF THE PREFERRED EMBODIMENTS

Figure 3:
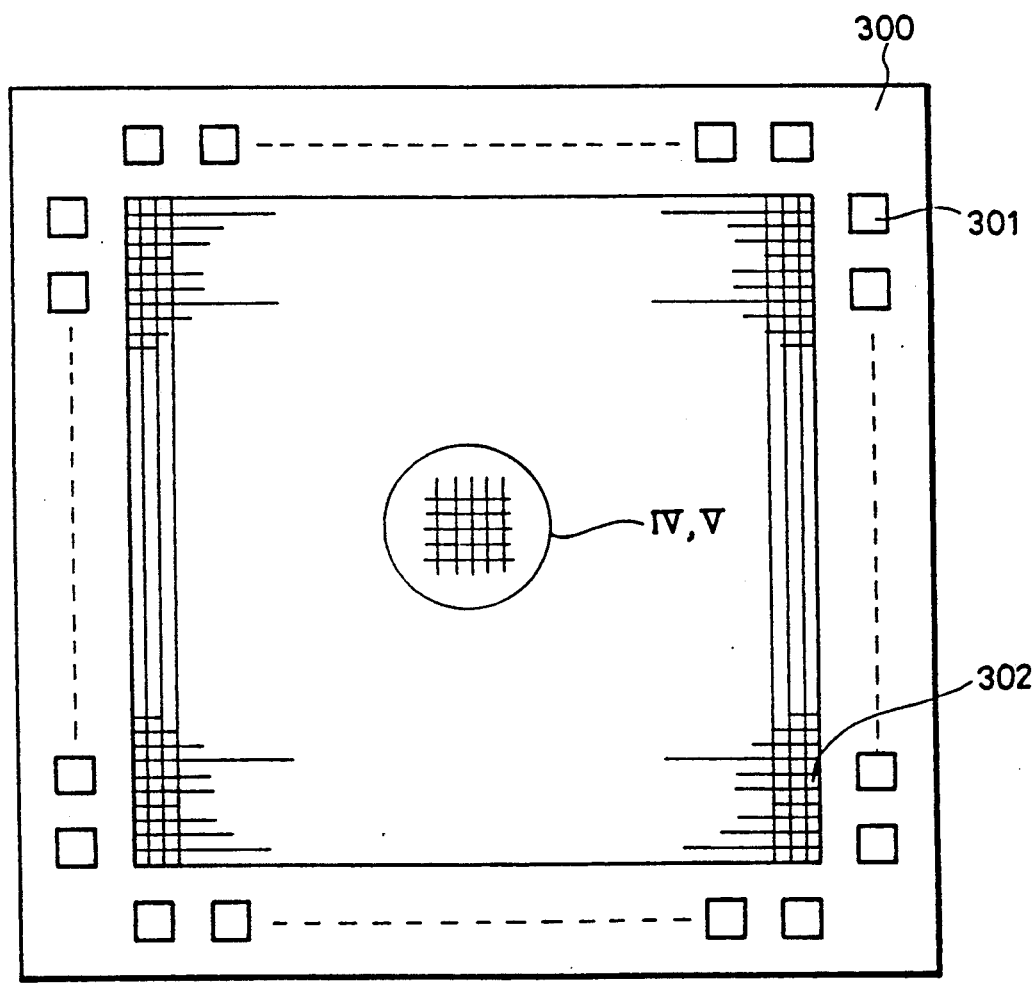
FIG. 3 is a plan view showing a schematic structure of a gate array as an example of a semiconductor device having field effect transistors in accordance with the present invention.

FIG. 3 is a plan view showing a whole structure of a gate array as one embodiment of the semiconductor device in accordance with the present invention. Referring to the figure, the gate array chip 300 comprises an input/output buffer and a pad region 301 arranged on the peripheral region thereof, and a region at the central portion in which elemental cells 302 are arranged. In the region on which the elemental cells 302 are to be arranged, a plurality of MOS transistors are formed. An enlarged view of the portions shown by IV or V of the region on which the elemental cells 302 are arranged is shown in FIGS. 4 or 5.

Figure 4:
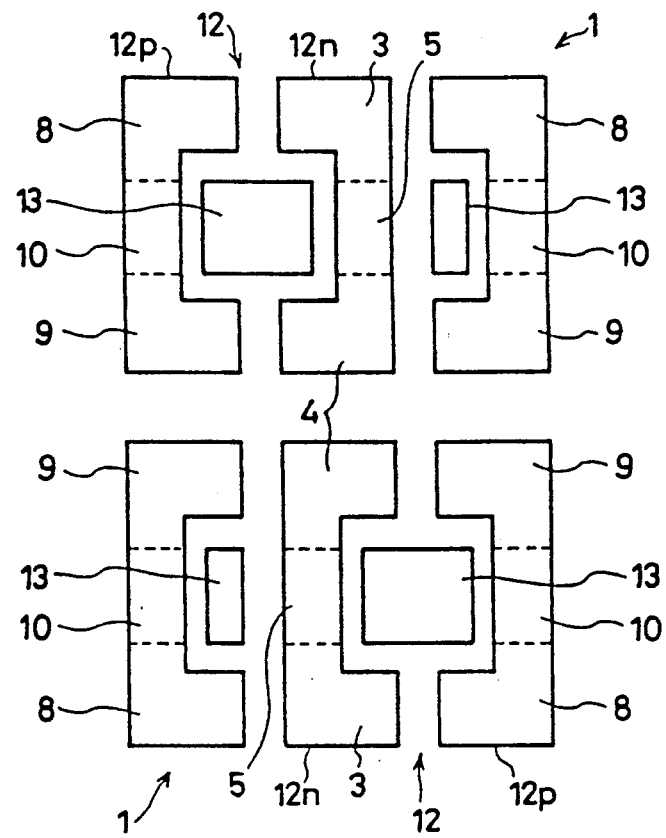
FIG. 4 is a plan view showing one embodiment of a semiconductor device having field effect transistors in accordance with the present invention.
Figure 5:
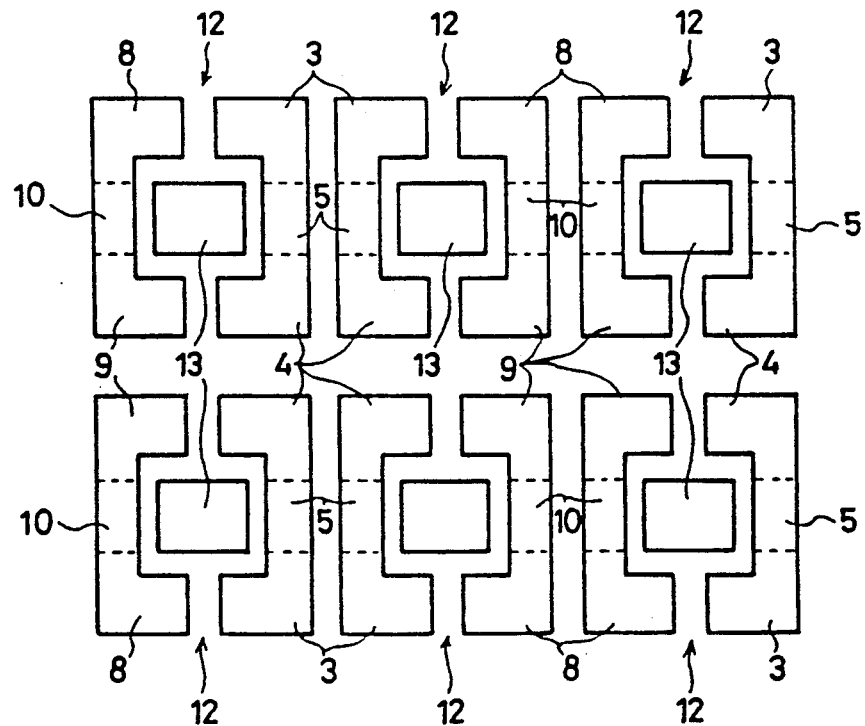
FIG. 5 is a plan view showing another embodiment of the semiconductor device having field effect transistors in accordance with the present invention.

FIG. 4 is a plan view showing an arrangement of the field effect transistors as one embodiment of the semiconductor device in accordance with the present invention. Referring to the figure, a p channel MOS transistor 1 is shown in a schematic perspective view of FIG. 6. A CMOS transistor 12 is shown in the schematic perspective view of FIG. 7. As shown in FIG. 4, a parallel arrangement of the p channel MOS transistors 1 and the CMOS transistors 12 are arranged spaced apart by a prescribed distance. FIG. 5 is a plan view showing another example of an arrangement of the field effect transistors constituting the semiconductor device in accordance with the present invention. In FIG. 5, CMOS transistors 12 are arranged spaced apart from each other by a prescribed distance.

Figure 6:
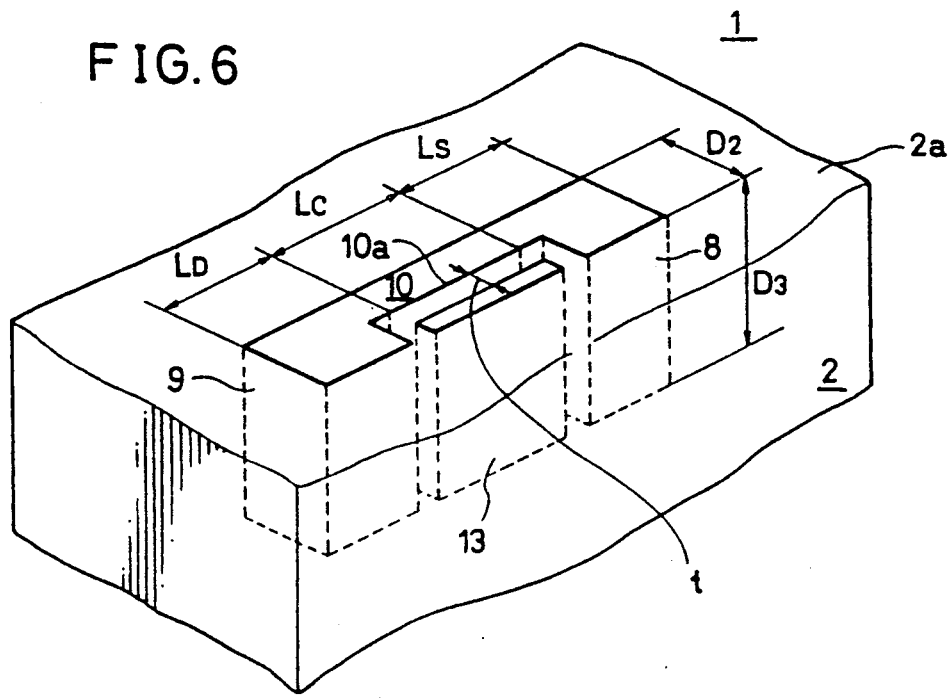
FIG. 6 is a schematic perspective view of a p channel MOS transistor constituting the semiconductor device of FIG. 4.
Figure 7:
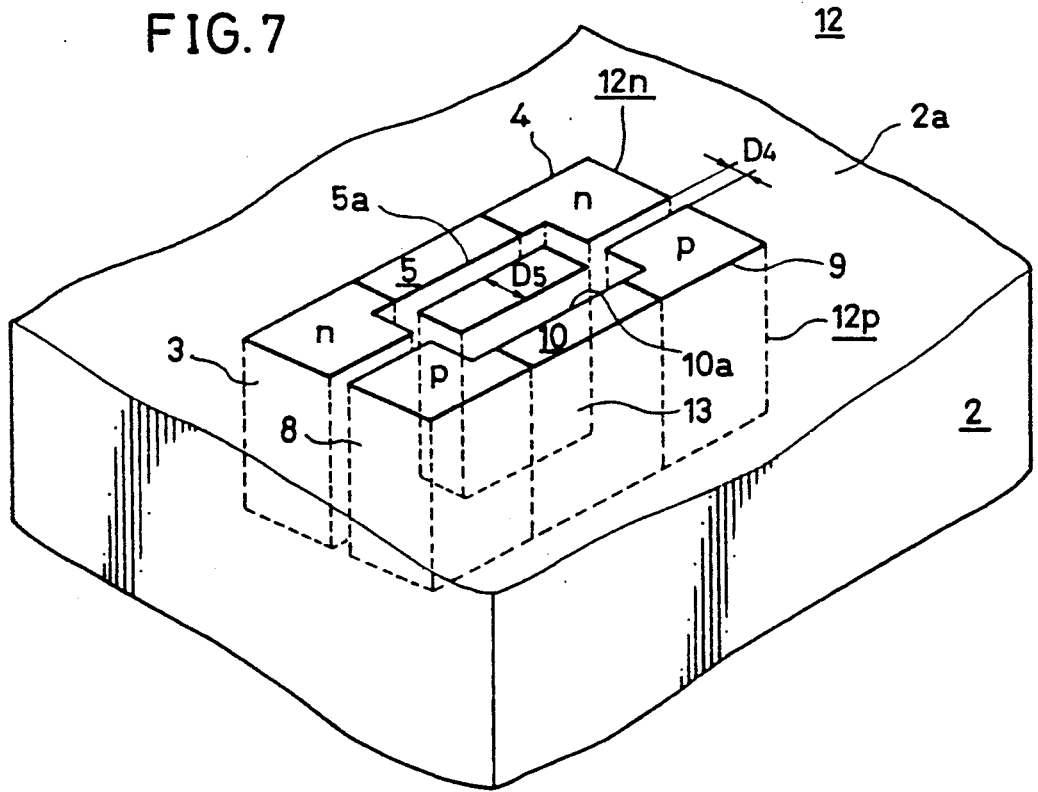
FIG. 7 is a schematic perspective view showing a CMOS transistor constituting the semiconductor device shown in FIGS. 4 and 5.

What is different from the conventional gate array is that in a p channel MOS transistor 1, the channel surface 10a defining the expansion of the carrier path in the channel region 10 is formed in a direction vertical to the main surface 2a of the substrate 2 as shown in FIG. 6, and that in the n channel MOS transistor 12n and p channel MOS transistor 12p, respective channel surfaces 5a and 10a defining the expansion of the carrier path in the channel regions 5 and 10 are formed parallel to each other and in the direction vertical to the main surface 2a of the substrate 2, as shown in FIG. 7. In addition, the gate 13 is formed extending in the direction vertical to the main surface 2a of the substrate 2. Further, the drains 4, 9 and sources 3, 8 are formed extending in the direction vertical to the main surface 2a of the substrate 2.

Figure 1:
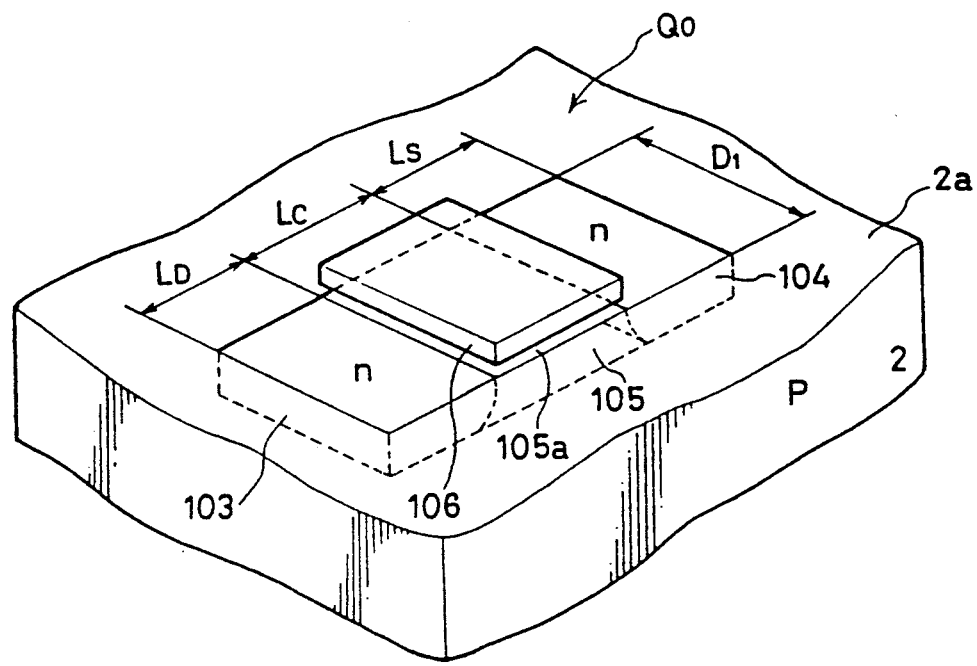
FIG. 1 is a schematic perspective view showing a field effect transistor constituting a conventional semiconductor device.
Figure 2:
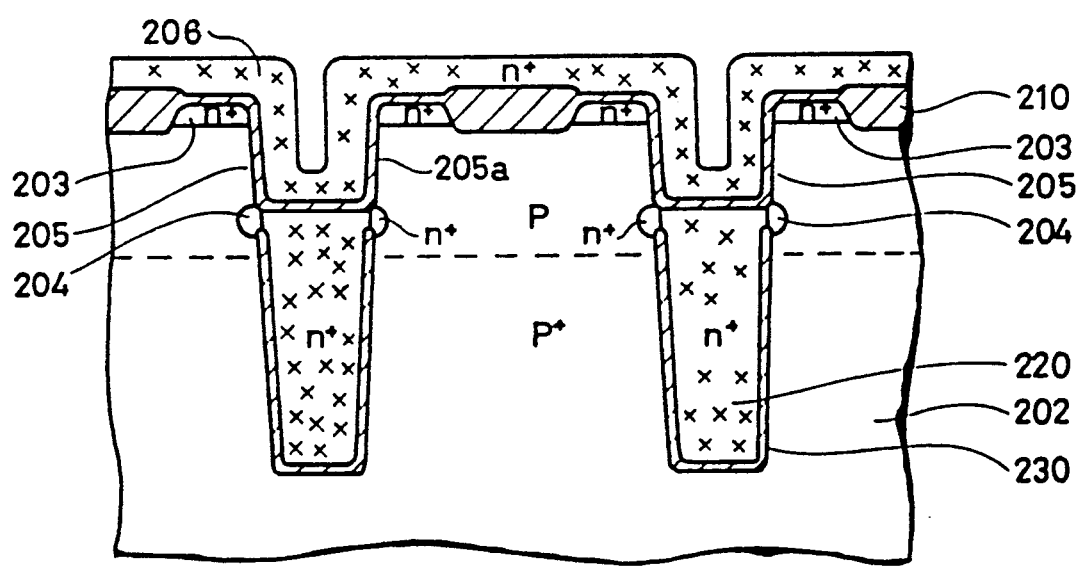
FIG. 2 is a partial cross sectional view showing one example of a semiconductor device comprising a conventional vertical field effect transistor.

By structuring as described above, the area of the gate array can be reduced. Referring to FIG. 6, the area $S_2$ required for forming the p channel MOS transistor 1 will be approximately $$S_2 = (L_C + L_D + L_S) \times D_2 \qquad (2)$$

where the width of the source 1 and the drain 9 on the main surface 2a are represented by $D_2$, for example. Since the width $D_2$ in the equation (2) is considerably smaller than the channel width $D_1$ in the equation (1) disclosed in the description of the prior art, the area $S_2$ on the main surface 2a of the substrate 2 occupied by the p channel MOS transistor 1 is very small compared with the conventional n channel MOS transistor $Q_0$ (FIG. 1). Therefore, the transistors can be highly integrated without miniaturizing each of the transistors 1, 12p, 12n constituting the gate array. In other words, the degree of integration of the transistors can be improved without shortening the channel length $L_C$, while maintaining the prescribed performance of the MOS transistor.

A method for manufacturing the n channel MOS transistor having the structure shown in FIG. 6 will be described in the following. FIGS. 8A to 8H are plan views showing the method for manufacturing the n channel MOS transistor having the structure shown in FIG. 6 in the order of the manufacturing steps, and FIGS. 9A to 9H are partial cross sectional views showing cross sections taken along the lines IX—IX in FIGS. 8A to 8H. The manufacturing steps will be described with reference to these figures.

Figure 8A:
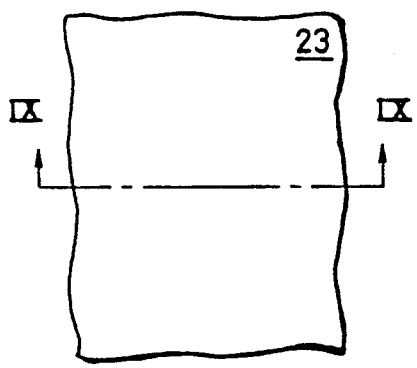
Figure 8B:
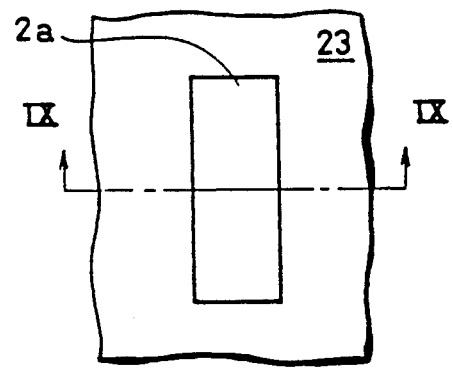
Figure 9A:
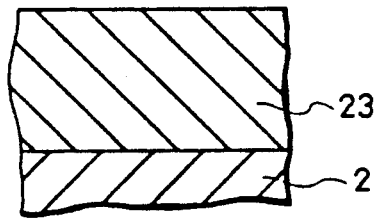
Figure 9B:
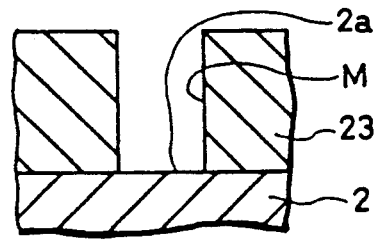

First, referring to FIGS. 8A and 9A, an oxide layer 23 for isolating elements having the thickness of several $\mu m$ is formed on a p type silicon substrate 2 by a CVD method (chemical vapor deposition method). Referring to FIGS. 8B and 9B, the oxide layer 23 for isolating elements corresponding to a region on which the MOS transistor is to be formed is removed by dry etching. Consequently, a concave portion M is formed in which the surface 2a of the p type silicon substrate 2 is exposed.

Figure 8C:
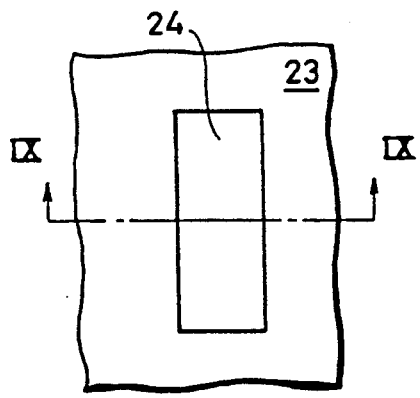
Figure 8D:
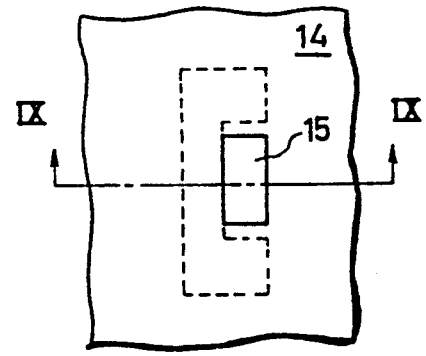
Figure 9C:
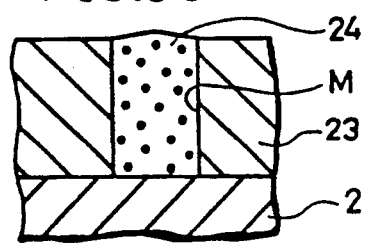
Figure 9D:
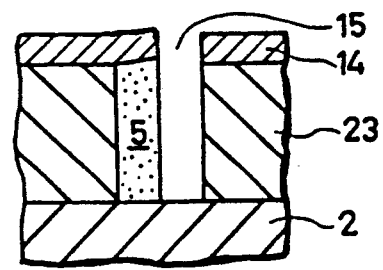

Thereafter, referring to FIGS. 8C and 9C, a single crystal silicon layer 24 is formed in the concave portion M by selective epitaxial growth. On this occasion, a convex portion is generated on the surface of the single crystal silicon layer 24, as shown in FIG. 9C. The convex portion is generated as a facet formed during the epitaxial growth appears. Thereafter, as shown in FIGS. 8D and 9D, boron is implanted from the upper surface of the single crystal silicon layer 24 and a silicon oxide layer 14 is formed on the upper surface of the oxide layer 23 for isolation. Thereafter, a trench 15 is formed by selectively etching a region on which the gate electrode is to be formed. The implantation of boron as p type impurities at this time is carried out with the accelerating voltage of the boron ion beam changed by several steps in order to control the distribution of boron in the depth direction (hereinafter referred to as multi-stage-voltage implantation). The trench 15 may be formed by etching after the formation of the single crystal silicon layer 24 with borons implanted previously.

Referring to FIGS. 8E and 9E, a silicon oxide layer 16 is formed on an inner wall surface of the trench 15 after the formation of the trench 15. That portion of the silicon oxide layer 16 which is formed on the side of the channel forming region 5 becomes a gate oxide layer of the MOS transistor. Thereafter, as shown in FIGS. 8F and 9F, a gate electrode material such as doped polysilicon is deposited on the upper portion of the substrate 2 (including the inside of the trench 15) by the CVD method, and thereafter patterning is carried out selectively by employing the photolithographic technique to form the gate 6.

Thereafter, as shown in FIGS. 8G and 9G, a resist 17 is applied on the entire surface, and only those regions on which the drain 4, source 3 and the channel region 5 are to be formed are opened by patterning. Thereafter, phosphorus is ion implanted by multi-stage-voltage implantation as n type impurities to the regions on which the drain 4 and the source 3 are to be formed by selfalignment using the resist 17 and the gate 6 as masks. Referring to FIGS. 8H and 9H, a silicon oxide layer 19 is formed on the entire surface, and contact holes 21 are formed by a photolithographic technology. Thereafter, aluminum wirings 22 are formed such that the wirings are respectively connected to the gate 6, the source 3 and the drain 4 through the contact holes. Finally, a protective layer (not shown) is formed on the upper surface thereof.

The n channel MOS transistor is formed in this manner.

A semiconductor device having the CMOS structure can be also manufactured on the structure provided through the above described manufacturing steps shown in FIGS. 8A to 8C (9A to 9C).

FIGS. 10A to 10H are plan views showing, in the order of the manufacturing steps, the method for manufacturing the CMOS field effect transistor shown in FIG. 7 which is another embodiment of the present invention. FIGS. 11A to 11H are cross sectional views taken along the lines XI—XI of these figures. The manufacturing method will be described with reference to these figures.

Figure 10A:
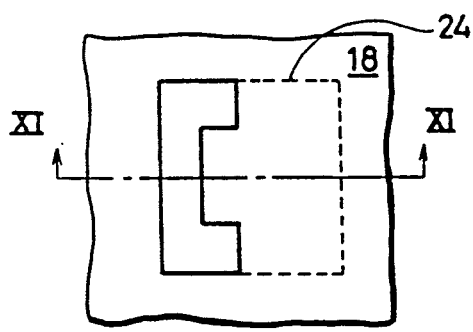
FIGS. 10A, 10B, 10C, 10D, 10E, 10F, 10G and 10H are plan views showing the method for manufacturing the CMOS transistor shown in FIG. 7 in the order of the manufacturing steps.
Figure 10B:
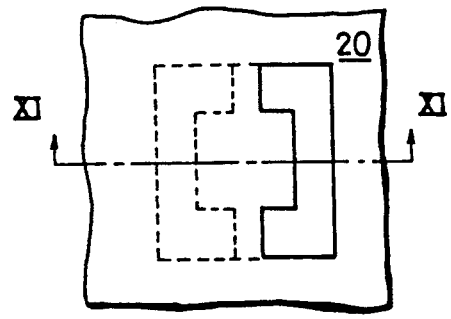
Figure 11A:
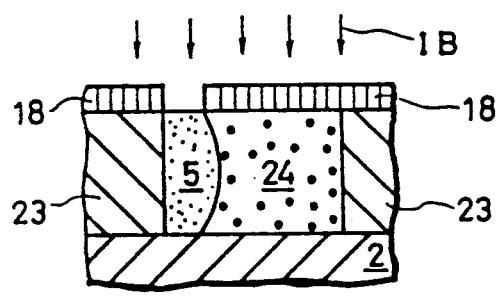
FIGS. 11A, 11B, 11C, 11D, 11E, 11F, 11G and 11H are partial cross sectional views showing the cross sections taken along the lines XI—XI of the plan views shown in FIGS. 10A to 10H.
Figure 11B:
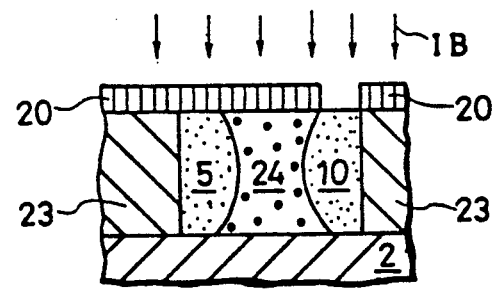

First, as shown in FIG. 10A, a resist 18 is formed on the oxide layer 23 for isolating elements and on the single crystal silicon layer 24, which were provided through the steps from FIG. 8A and 9A to 8C and 9C. Boron as p type impurities is ion implanted in the direction shown by an arrow IB in those regions of the single crystal silicon layer 24 on which the drain 4, source 3 and the channel region 5 of the n channel MOS transistor are to be formed, using the resist 18 as a mask. After the resist 18 is removed, a resist 20 is applied as shown in FIGS. 10B and 11B. Phosphorus as the n type impurities is ion implanted in the direction shown by the arrow IB to those regions of the single crystal silicon layer 24 on which the drain 9, source 8 and channel region 10 of the p channel MOS transistor are to be formed, using the resist 20 as a mask. On this occasion, the boron or phosphorus is implanted by multi-stage-voltage implantation in order to control the distribution of boron (phosphorus) in the depth direction.

Figure 10C:
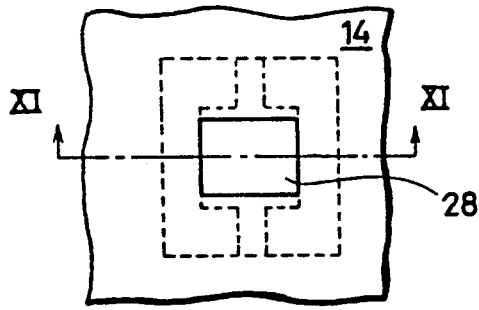
Figure 10D:
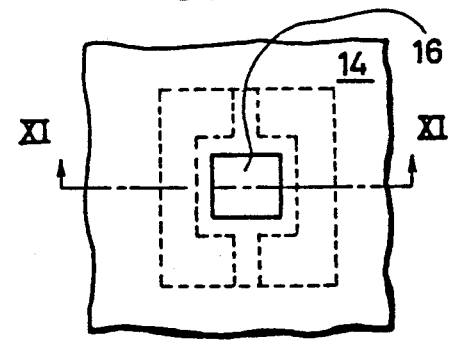
Figure 11C:
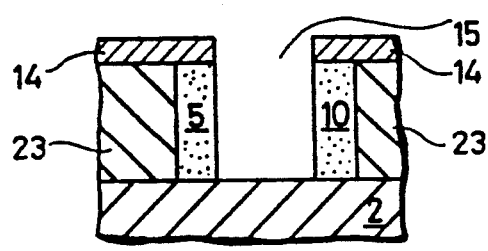
Figure 11D:
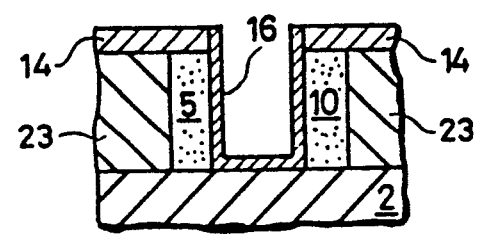

Referring to FIGS. 10C ad 11C, the resist 20 is removed, and thereafter a silicon oxide layer 14 is formed on the substrate 2. A trench 15 is formed on that region on which the gate to be formed by selective etching. The position of the trench 15 is determined such that the trench 15 is in direct contact with the channel regions 5 and 10. After the trench 15 is formed, a silicon oxide layer 16 is formed on the inner wall surface of the trench 15 as shown in FIGS. 10D and 11D. Those portions of the silicon oxide layer 16 which are formed on the sides of the channel regions 5 and 10 will be the gate oxide layer of the CMOS transistor.

Figure 10E:
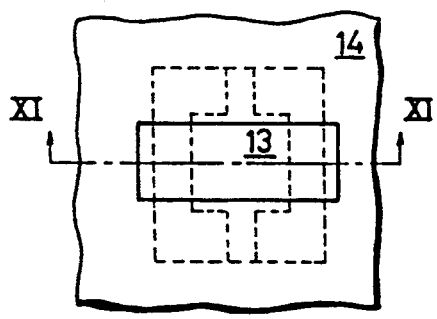
Figure 10F:
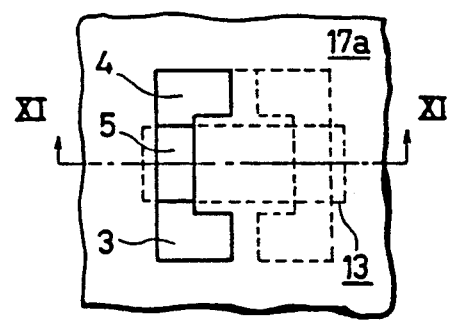
Figure 11E:
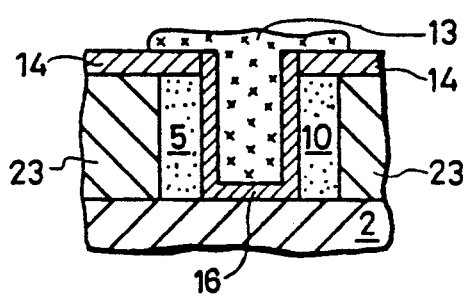
Figure 11F:
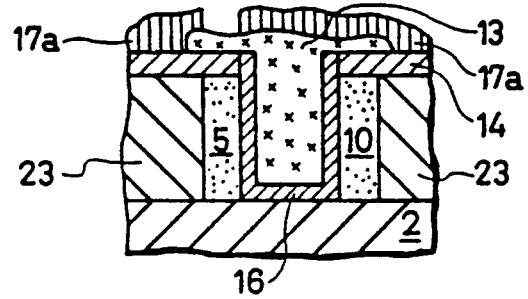
Figure 10G:
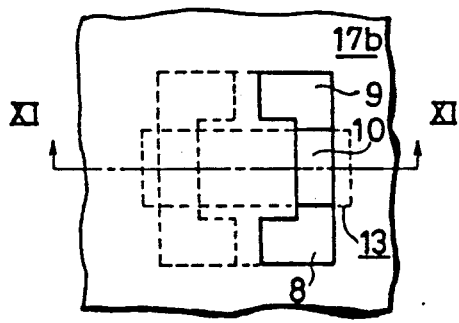
Figure 10H:
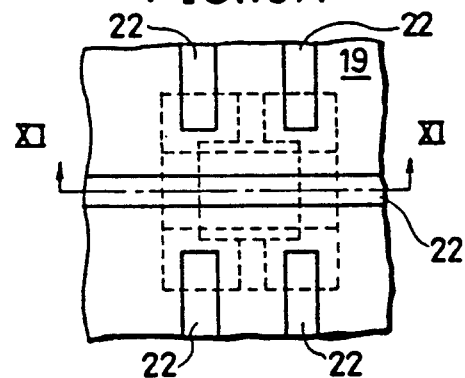
Figure 11G:
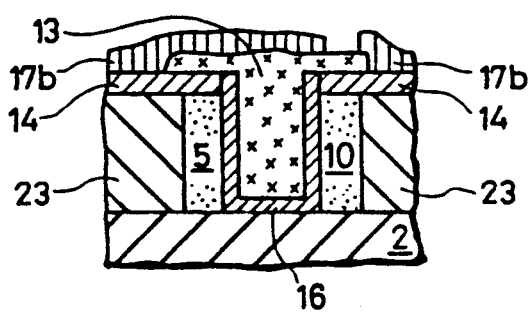
Figure 11H:
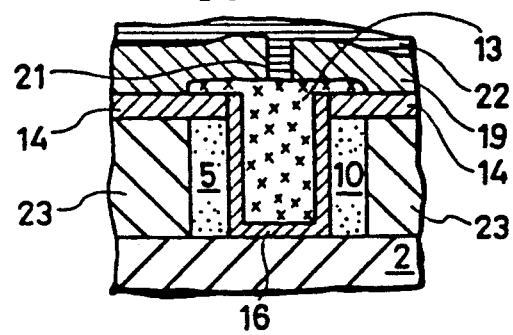

As shown in FIGS. 10E and 11E, a doped polysilicon is deposited on the upper portion of the substrate 2 (including the inside of the trench 15) by the CVD method and the gate 13 is formed by selective patterning by photolithography. As is apparent from the figure, the gate 3 is formed to cover the channel regions 5 and 10 over the silicon oxide layer 16. Referring to FIGS. 10F and 11F, a resist 17a is applied in accordance with a prescribed pattern. Thereafter, phosphorus as n type impurities is multi-stage-voltage implanted only to those regions on which the drain 4 and the source 3 of the n channel MOS transistor are to be formed by selfalignment using the resist 17a and the gate 13 as masks. Thereafter the resist 17a is removed, and a resist 17b having a prescribed pattern is applied as shown in FIGS. 10G and 11G. Boron as p type impurities is multi-stage-voltage implanted only in those regions on which the drain 9 and the source 8 of the p channel MOS transistor are to be formed by selfalignment using the resist 17b and the gate 13 as masks. The formation of the drains 4, 9 and sources 3, 8 by the multi-stage-voltage implantation of phosphorus and boron are carried out by selfalignment using the resists 17a and 17b and the gate 13 as masks, so that there will be no misalignment of the drains 4 and 9 and of the sources 3 and 8 in association with the channel regions 5 and 10 caused by the misregestration of the resist 17a or 17b. Therefore, even if the degree of integration is improved, the electrical characteristics of the CMOS transistor 12 are not degraded. The formation of the drain and source of the selfalignment is also carried out in the method for manufacturing the n channel MOS transistor shown in FIGS. 8G and 9G.

Now, in this embodiment, the drains 4 and 8 and the sources 3 and 9 must be formed relatively deep. Therefore, the expansion of the implanted phosphorus and boron in the horizontal direction (especially the expansion in the direction to the channel regions 5 and 10) must be controlled, preventing the influence to the electrical characteristics of the CMOS transistor 12. The control is carried out by the multi-stage-voltage implantation in accordance with the relations between the expansions of the phosphorus and boron in the horizontal direction, the depth of implantation, the accelerating voltage of the ion beams of phosphorus and boron which were previously examined by experiments and so on. When the drain 9 and the source 8 are to be formed with the channel width of about 1 μm, namely, the implanting depth of boron of that size by implanting boron, for example, the multi-stage-voltage implantation must be carried out (the length of invasion is 0.899 μm), 240 keV (the length of invasion is 0.611 μm), 120 keV (the length of invasion is 0.350 μm) and 50 keV (the length of invasion is 0.161 μm). By doing so, the drain 9 and source 8 have uniform distribution of boron over the length of about 1 μm.

Thereafter, the resist 17b is removed and a silicon oxide layer 19 is formed on the entire surface. Contact holes 21 are formed in the silicon oxide layer 19 by photolithography. Aluminum wirings are formed to be connected to the gate 13, drains 4, 9 and the sources 3, 9 respectively, through the contact holes 21. Finally, a protection layer (not shown) is formed on the entire surface.

The CMOS transistor shown in FIG. 7 is manufactured in this manner.

As an example of the MOS transistor manufactured through the above described method, a MOS transistor having the following dimensions can be provided. Referring to FIGS. 6 and 7, $$L_O = L_C = L_S = 1.0 \ \mu m, \ D_2 = D_3 = 1.0 \ \mu m$$

$$D_4 = 0.5 \ \mu m, \ D = 1.0 \ \mu m, \ t = 200 \ \text{Å}$$

The impurity concentration of the semiconductor substrate is up to $10^{15}/cm^3$, the impurity concentration of the channel regions is up to $10^{16}/cm^3$ and the impurity concentration of the source and drain is up to $10^{20}/cm^3$, in that case.

The single crystal silicon layer 24 is formed by selective epitaxial growth in the above embodiment. Alternatively, amorphous silicon may be deposited on the entire surface after the manufacturing steps shown in FIGS. 8A and 8B (FIGS. 9A and 9B), and the amorphous silicon may be turned into single crystal by solid phase epitaxial growth using the surface 2a of the p type silicon substrate 2 as seeds. In that case, the single crystal layer is left only in the portion corresponding to the main surface 2a of the p type silicon substrate 2, and other portions are removed to form the single crystal silicon layer 24 in the concave portion M. In depositing the amorphous silicon, polysilicon may be turned into amorphous by first depositing the polysilicon and implanting silicon thereto, instead of simply depositing the amorphous silicon.

Figure 12:
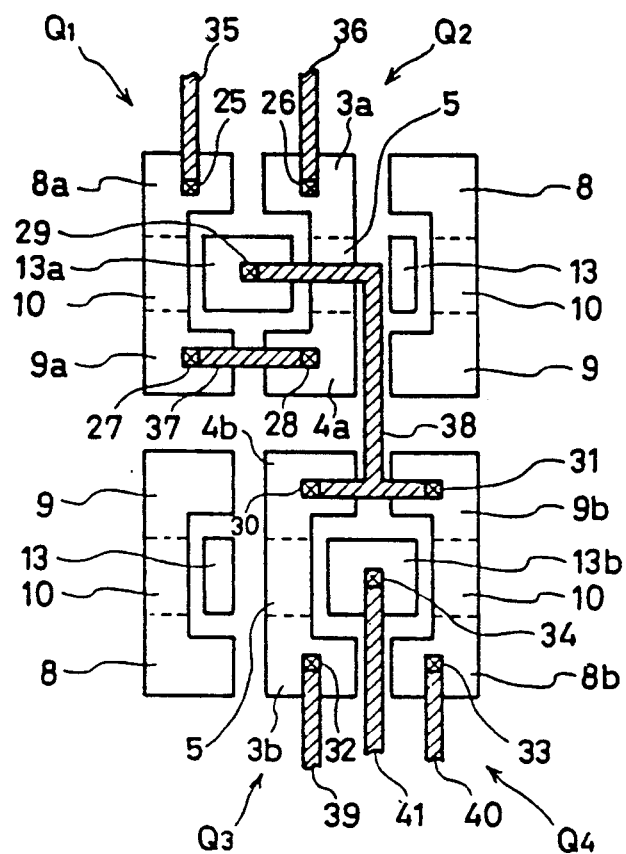
FIG. 12 is a plan view showing an application of the semiconductor device shown in FIG. 4.

One application of the semiconductor device shown in FIG. 4 will be described in the following with reference to FIGS. 12 and 13. In order to simplify the description, the reference character $Q_1$ represents a p channel MOS transistor comprising a source 8a, a drain 9a and a gate 13a. The reference character $Q_2$ represents an n channel MOS transistor comprising a source 3a, a drain 4a and a gate 13a. The reference numeral $Q_3$ represents an n channel MOS transistor comprising a source 3b, a drain 4b and a gate 13b. The reference character $Q_4$ represents a p channel MOS transistor comprising a source 8b, a drain 9b and a gate 13b. In FIG. 12, the numerals 25 to 34 represent contact holes. The source 8a and the wiring 35 are connected to each other through the contact hole 25 and the supply potential Vcc is supplied to the source 8a. The source 3a of the n channel MOS transistor $Q_2$ is connected to the wiring 36 through the contact hole 26 to supply the ground potential GND to the source 3a. The drains 4a and 9a are connected by the wiring 37 through the contact holes 28 and 27. The gate 13a and the drains 4b and 9b are connected by the wiring 38 through the contact holes 29, 30 and 31. The source 3b and the wiring 39 are connected to each other through the contact hole 32 so that the ground potential GND is supplied to the source 3b. The source 8b is connected to the wiring 40 through the contact hole 33, so that the supply potential Vcc is supplied to the source 8b. The gate 13b and the wiring 41 are connected through the contact hole 34 to receive a control input. An equivalent circuit of the semiconductor device structured as described above is shown in FIG. 13.

Figure 13:
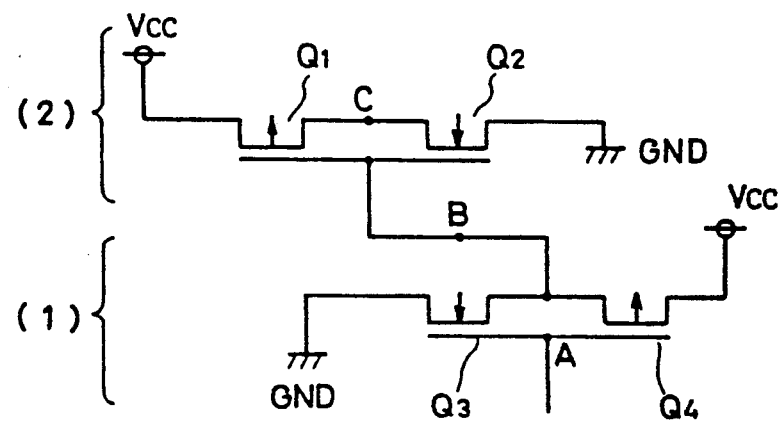
FIG. 13 is a schematic diagram showing an equivalent circuit of FIG. 12.

As shown in FIG. 13, the circuit structured as described above comprises a lower inverter (1) and an upper inverter (2) connected to each other. The operation of the circuit will be described in the following. when a high voltage is applied to a point A which corresponds to the gate of the inverter (1), a p channel MOS transistor $Q_4$ of the inverter (1) turns off and an n channel MOS transistor $Q_3$ turns on. Consequently, the potential at a common drain (point B) of the p channel MOS transistor $Q_4$ and the n channel MOS transistor $Q_3$ constituting the inverter (1) becomes low. The low level potential at the point B is applied to the gate of the upper inverter (2), whereby a p channel MOS transistor $Q_1$ of the inverter (2) turns on and an n channel MOS transistor $Q_2$ turns off. Therefore, the potential at the common drain (point C) becomes high level.

On the contrary, when a low level potential is supplied to the point A, the common drain (point B) of the inverter (1) becomes high level, and the reverse operation is carried out. The circuit may be used as a buffer for shaping waveforms, as an inverter chain or an oscillator.

Figure 14:
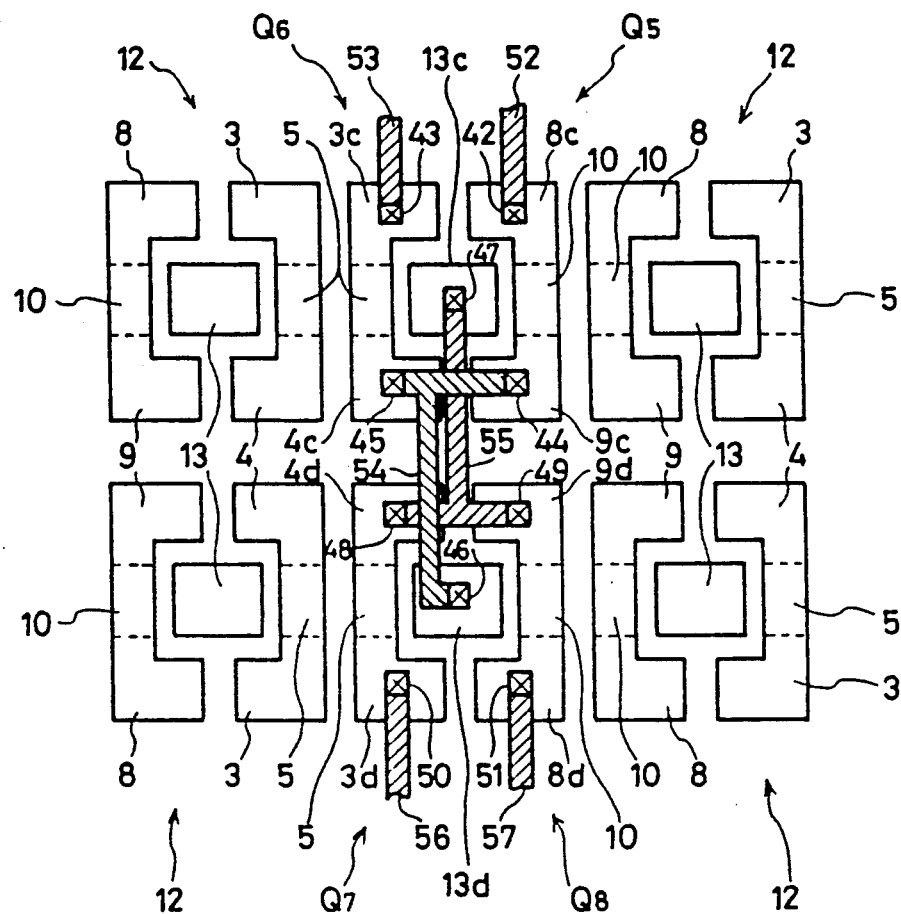
FIG. 14 is a plan view showing an application of the semiconductor device shown in FIG. 5.
Figure 15:
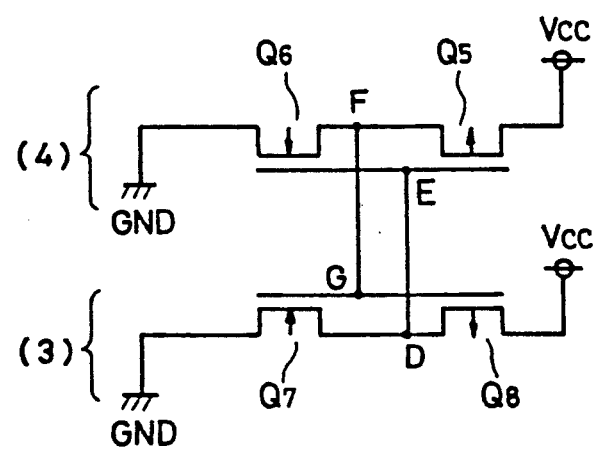
FIG. 15 is a schematic diagram showing an equivalent circuit of FIG. 14.

One application of the semiconductor device shown in FIG. 5 will be described with reference to FIGS. 14 and 15. The structure of the transistors are as follows. The reference character $Q_5$ represents a p channel MOS transistor comprising a source 8c, a drain 9c and a gate 13c. The reference character $Q_6$ represents an n channel MOS transistor comprising a source 3c, a drain 4c and a gate 13c. The reference character $Q_7$ represents an n channel transistor comprising a source 3d, a drain 4d and a gate 13d. The reference character $Q_8$ represents a p channel MOS transistor comprising a source 8d, a drain 9d and a gate 13d. In FIG. 14, reference numerals 42 to 51 represent contact holes, and the source 8c and wiring 52 are connected through the contact hole 42 to supply the supply potential Vcc to the source 8c. The source 3c is connected to the wiring 53 through the contact hole 43, and the ground potential GND is supplied to the source 3c. The drains 4c, 9c and the gate 13d are connected by the wiring 54 through contact holes 45, 44 and 46. The gate 13c and the drains 4d and 9d are connected by the wiring 55 through the contact holes 47 to 49. The source 3d is connected to the wiring 56 through the contact hole 50, and the ground potential GND is supplied to the source 3d. In addition, the source 8d is connected to the wiring 57 through the contact hole 51, and the supply potential Vcc is supplied to the source 8d. An equivalent circuit of the semiconductor substrate structured as described above is shown in FIG. 15.

The circuit structured as described above represents a portion of a flip flop in which one gate of the two inverters (3) and (4) is connected to a common drain of the other one of the inverters. The operation of the circuit will be described in the following. For example, when the potential at the common drain (point D) of the lower inverter (3) is set at a high level, the potential at the gate (point E) of the upper inverter (4) also becomes high level. Consequently, the n channel MOS transistor $Q_6$ of the upper inverter (4) turns on and the p channel MOS transistor $Q_5$ turns off. On this occasion, the potential at the common drain (point F) of the upper inverter (4) becomes low level, which potential in turn applied to the gate (point G) of the lower inverter (3). Therefore, the p channel MOS transistor $Q_8$ of the lower inverter (3) turns on and the n channel MOS transistor $Q_7$ turns off. Consequently, the potential of the common drain (point D) becomes high level. Therefore, even if the high level voltage initially applied to the point D is removed, the high level potential is maintained at the point D.

On the contrary, when a low level voltage is applied to the point D, the potential of the low level is maintained at the point D even if the externally applied voltage is removed.

Such operation can be used for a memory cell of a static RAM.

Although description was given of a case in which two types of transistors, namely, n channel MOS transistor and p channel MOS transistor are used as the field effect transistors constituting the semiconductor device in the above embodiment, the present invention can also be applied when the device is structured only by n channel MOS transistors or by p channel MOS transistors.

As described above, according to the present invention, the channel surface and the gate electrode are formed vertical to the main surface of the substrate, whereby the horizontal area occupied by one field effect transistor on the main surface can be reduced. Therefore, a semiconductor device can be provided which has field effect transistors integrated to a higher degree without degrading electrical performance of the transistor, without miniaturizing each of the field effect transistors itself. In addition, since the channel region is formed in selfalignment in accordance with the manufacturing method of the present invention, the channel length can be easily controlled.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor device having a field effect transistor of a first conductivity type and a field effect transistor of a second conductivity type, comprising the steps of:

preparing a semiconductor substrate having a main surface;

forming an insulating layer on the main surface of said semiconductor substrate;

forming a hole whose bottom surface is a portion of the main surface, which is exposed, of said semiconductor substrate in said insulating layer;

forming a single crystal semiconductor layer on the main surface of said semiconductor substrate in said hole;

forming a first single crystal semiconductor layer portion of a first conductivity type by selectively doping impurities of the first conductivity type in said single crystal semiconductor layer;

forming a second single crystal semiconductor layer portion of a second conductivity type by selectively doping impurities of the second conductivity type in said single crystal semiconductor layer;

forming a field effect transistor of the second conductivity type in an inner region of said hole including said first single crystal semiconductor layer portion; and forming a field effect transistor of the first conductivity type in an inner region of said hole including said second single crystal semiconductor layer portion.

2. A method for manufacturing a semiconductor device having field effect transistors, comprising the steps of:

preparing a semiconductor substrate having a main surface;

forming an insulating layer on the main surface of said semiconductor substrate;

forming a hole with a bottom surface being a portion of the main surface, which is exposed, of said semiconductor substrate in said insulating layer;

forming a single crystal semiconductor on the main surface of said semiconductor substrate in said hole; and forming a field effect transistor in an inner region of said hole including said single crystal semiconductor layer; wherein said step of forming the field effect transistor comprises the steps of:

forming a single crystal semiconductor layer of a first conductivity type by doping impurities of the first conductivity type in said single crystal semiconductor layer;

forming a hole for forming a gate electrode whose bottom surface is the main surface of said semiconductor substrate and whose side wall surface is at least said single crystal semiconductor layer, by selectively removing said single crystal semiconductor layer;

forming a gate insulating layer on the side wall surface of said single crystal semiconductor layer in said hole for forming the gate electrode;

forming the gate electrode on said gate insulating layer in said hole for forming the gate electrode; and forming first and second impurity regions of a second conductivity type spaced apart from each other by selectively doping impurities of the second conductivity type in a region of said single crystal semiconductor layer.

3. A method for manufacturing a semiconductor device having field effect transistors according to claim 2, wherein said step of forming said hole in said insulating layer comprises formation of a hole having an approximately rectangular horizontal shape in the insulating layer;

said step of forming the single crystal semiconductor layer in said hole comprises formation of a single crystal semiconductor layer having a horizontal shape of approximately rectangular with one side opened;

said step of forming said gate electrode comprises formation of a conductive layer buried in said hole for forming the gate electrode sandwiched by the single crystal semiconductor layer of said approximately rectangular shape with one side opened; and said step of forming said first and second impurity regions comprises formation of impurity regions on opposing end portions of said approximately rectangular shape with one side opened.

4. A method for manufacturing a semiconductor device having field effect transistors according to claim 2, wherein said step of forming said gate electrode comprises formation of the electrode portion buried in said hole for forming the gate electrode and of the contact portion extending from the electrode portion over the upper surface of said single crystal semiconductor layer with an insulating layer interposed therebetween; and said step of forming said first and second impurity regions comprises formation of the impurity regions in selfalignment using said contact portion as a portion of a mask.

5. A method for manufacturing a semiconductor device having field effect transistors, comprising the steps of:

preparing a semiconductor substrate having a main surface;

forming an insulating layer on the main surface of said semiconductor substrate;

forming a hole with a bottom surface being a portion of the main surface, which is exposed, of said semiconductor substrate in said insulating layer;

forming a single crystal semiconductor on the main surface of said semiconductor substrate in said hole;

forming a first single crystal semiconductor layer portion of a first conductivity type by selectively doping impurities of the first conductivity type in said single crystal semiconductor layer;

forming a second single crystal semiconductor layer portion of a second conductivity type by selectively doping impurities of the second conductivity type in said single crystal semiconductor layer;

forming a field effect transistor of the second conductivity type in an inner region of said hole including said first single crystal semiconductor layer portion;

forming a field effect transistor of the first conductivity type in an inner region of said hole including said second single crystal semiconductor layer portion and forming a hole for forming a gate electrode whose bottom surface is the main surface of said semiconductor substrate and whose side wall surface is at least said single crystal semiconductor layer portion and said second single crystal semiconductor layer portion, by selectively removing said single crystal semiconductor layer; wherein said step of forming the field effect transistor of said second conductivity type comprises the steps of forming a first gate insulating layer on the side wall surface of said first single crystal semiconductor layer portion in said hole for forming the gate electrode, forming a first gate electrode on said first gate insulating layer in said hole for forming the gate electrode, and forming first and second impurity regions of the second conductivity type spaced apart from each other by selectively doping impurities of the second conductivity type in a region of said first single crystal semiconductor layer portion; and said step of forming the field effect transistor of said first conductivity type comprises the steps of forming a second gate insulating layer on the side wall surface of said second single crystal semiconductor layer portion in said hole for forming the gate electrode, forming a second gate electrode on said second gate insulating layer in said hole for forming the gate electrode, and forming third and fourth impurity regions of the first conductivity type spaced apart from each other by selectively doping impurities of the first conductivity type in a region of said second single crystal semiconductor layer portion.

6. A method for manufacturing a semiconductor device having field effect transistors according to claim 5, wherein said steps of forming said first gate electrode and said second gate electrode comprise formation of a common gate electrode in which the first and second gate electrodes are formed integrally.

7. A method for manufacturing a semiconductor device having field effect transistors according to claim 5, wherein said step of forming said hole in said insulating layer comprises formation of a hole having an approximately rectangular horizontal shape in the insulating layer;

said step of forming said first single crystal semiconductor layer portion comprises formation of the single crystal semiconductor layer portion of the first conductivity type having a horizontal shape of approximately rectangular with one side opened along one side wall surface of said hole;

said step of forming said second single crystal semiconductor layer portion comprises formation of the single crystal semiconductor layer portion of the second conductivity type having a horizontal shape of approximately rectangular with one side opened along the other side wall surface of said hole opposing to said first single crystal semiconductor layer portion;

said steps of forming said first gate electrode and said second gate electrode comprise formation of a conductive layer in a region surrounded by said first single crystal semiconductor layer portion and said second single crystal semiconductor layer portion, insulated therefrom and buried in said hole for forming the gate electrode;

said step of forming said first and second impurity regions comprises formation of the impurity regions at opposing end portions of the approximately rectangular shape with one side opened of said first single crystal semiconductor layer portion; and said step of forming said third and fourth impurity regions comprises formation of the impurity regions at opposing end portions of the approximately rectangular shape with one side opened of said second single crystal semiconductor layer portion.

8. A method for manufacturing a semiconductor device having field effect transistors according to claim 5, wherein said steps of forming said first gate electrode and said second gate electrode comprise formation of an electrode portion buried in said hole for forming the gate electrode and of a contact portion extending from the electrode portion over upper surfaces of said first single crystal semiconductor layer portion and said second single crystal semiconductor layer portion with an insulating layer interposed therebetween; and said steps of forming said first and second impurity regions and said third and fourth impurity regions comprise formation of the impurity regions in selfalignment using said contact portion as a portion of a mask.

* * * * *